United States Patent [19]

Bohr et al.

[11] Patent Number: 5,091,332

[45] Date of Patent: Feb. 25, 1992

[54] SEMICONDUCTOR FIELD OXIDATION PROCESS

[75] Inventors: Mark T. Bohr, Aloha; Lawrence N. Brigham, Jr., Beaverton; Shahab Hossaini, Aloha, all of Oreg.

[73] Assignee: Intel Corporation, Santa Clara, Calif.

[21] Appl. No.: 615,445

[22] Filed: Nov. 19, 1990

[51] Int. Cl.[5] .................. H01L 21/76; H01L 21/266
[52] U.S. Cl. .................. 437/69 G; 437/57; 437/34
[58] Field of Search .............. 437/34, 56, 57, 63, 437/69

[56] References Cited

U.S. PATENT DOCUMENTS

| | | | |
|---|---|---|---|
| 3,920,481 | 11/1975 | Hu | 437/34 |
| 4,013,484 | 3/1977 | Boleky et al. | 437/34 |
| 4,422,885 | 12/1983 | Blower et al. | 437/34 |
| 4,426,766 | 1/1984 | Lee | 437/34 |
| 4,578,859 | 4/1986 | Hause et al. | 437/69 |
| 4,707,455 | 11/1987 | Tsang et al. | 437/57 |
| 4,906,595 | 3/1990 | van der Plas et al. | 437/69 |

FOREIGN PATENT DOCUMENTS

| | | | |
|---|---|---|---|
| 54-122982 | 9/1979 | Japan | 437/69 |
| 58-17656 | 2/1983 | Japan | 437/57 |
| 60-38868 | 2/1985 | Japan | 437/34 |

Primary Examiner—Olik Chaudhuri
Assistant Examiner—G. Fourson
Attorney, Agent, or Firm—Blakely, Sokoloff, Taylor & Zafman

[57] ABSTRACT

Front end processing for a CMOS substrate resulting in the formation of n-wells, p-wells, channel stops and field oxide regions. Both the n-type and p-type dopant are implanted through silicon nitride members with one type dopant being first blocked by a first layer of photoresist and the second dopant by a second layer of photoresist. The field oxide regions are grown after the first dopant is implanted. Relatively low level ion implantation is used and additional threshold adjusting implants are not needed.

12 Claims, 2 Drawing Sheets

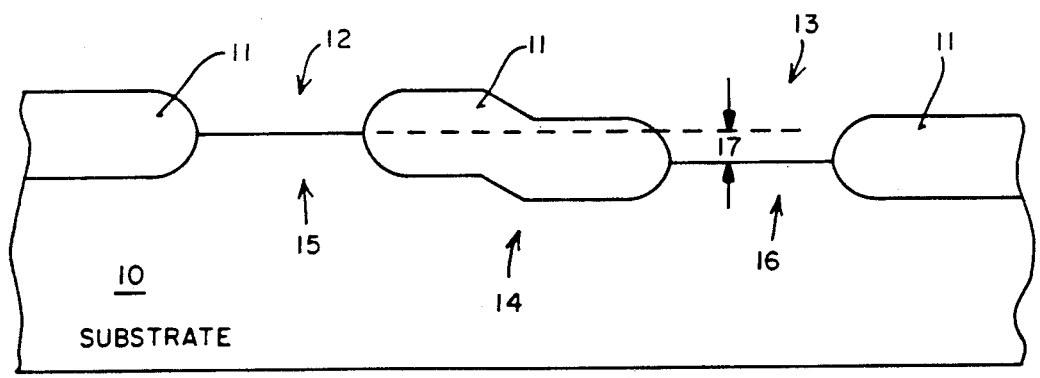
FIG_1 (PRIOR ART)
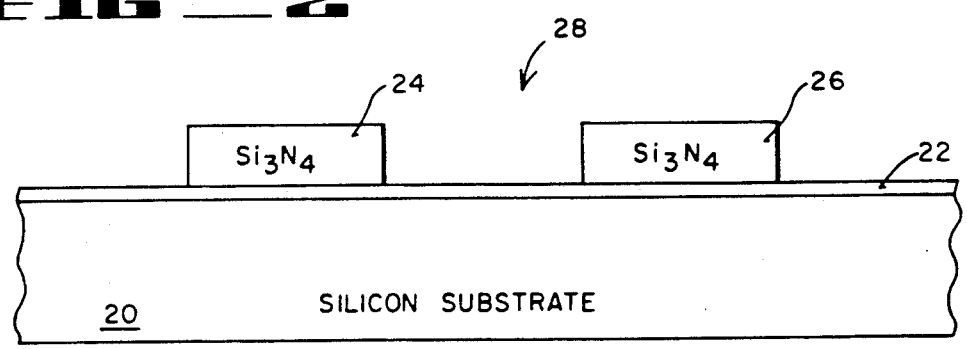
FIG_2
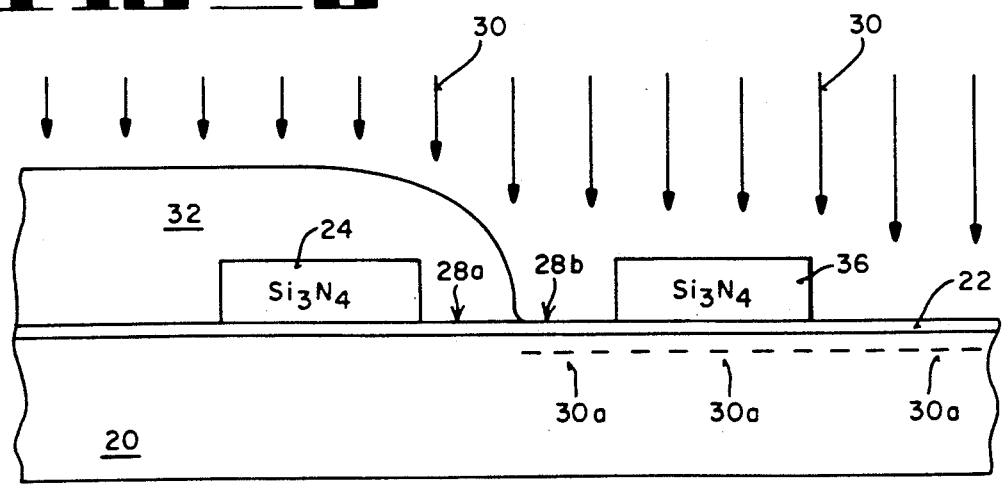
FIG_3

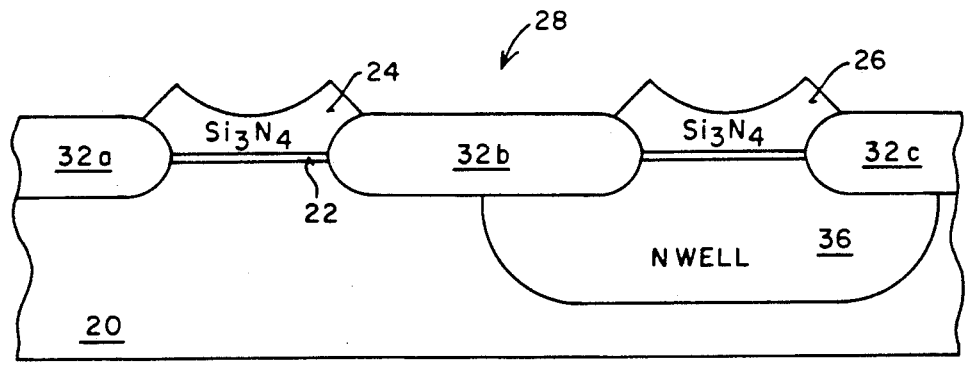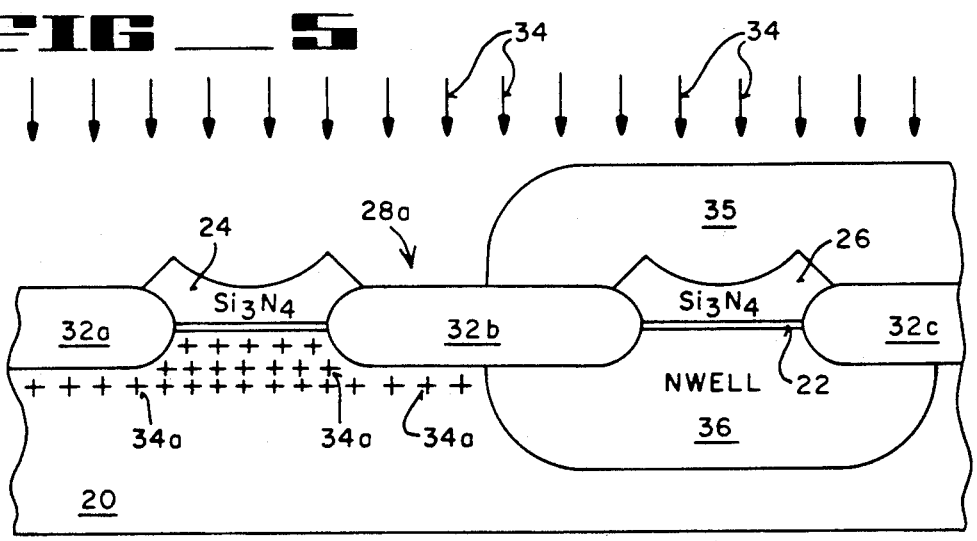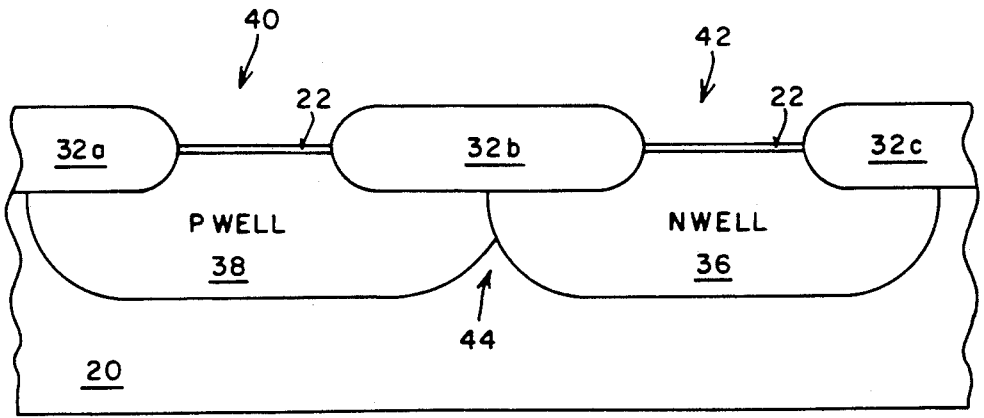

SEMICONDUCTOR FIELD OXIDATION PROCESS

BACKGROUND OF THE INVENTION

1. Field of the Invention

The invention relates to the field of semiconductor processing and, more particularly, the "front end" processing used for formation of isolation or field oxide regions and underlying channel stops.

2. Prior Art

In the fabrication of metal-oxide-semiconductor (MOS) integrated circuits, active devices such as field effect transistors are often separated on the substrate, one from the other, by field oxide regions. These relatively thick regions of silicon dioxide provide greater separation and hence less coupling between overlying conductors and the substrate, thereby reducing parasitic current paths. Often channel stops are formed in the substrate beneath these regions to further reduce parasitic current paths. In complementary MOS circuits, the field oxide regions and the underlying channel stops are particularly important since they reduce "latch-up".

Typically, field oxide regions are grown through local oxidation. Silicon nitride masking members are first formed on the substrate at the regions where active devices are to be fabricated and then the substrate is subjected to an oxidation step. The oxidation grows in the areas unprotected by the silicon nitride. This is described in U.S. Pat. No. 3,873,383.

Various processes are known for forming the field oxide regions in conjunction with channel stops. An early example of such processing is shown in U.S. Pat. No. 4,013,484, where fully aligned channel stops are formed. Another technique for providing channel stops through use of an ion implanted surface layer is described in "Surface Doping Using Ion Implantation For Optimum Guard Layer Design In COS/MOS Structures" by Douglas and Dingwall, *IEEE Transactions on Electronic Devices* (Vol. ED22), October 1975 beginning at page 849. One disadvantage to the processing described in this article is that the n-type and p-type regions of the channel stops are spaced apart thereby decreasing device density.

Another process is described in U.S. Pat. No. 4,282,648. Here one region is double doped (first with n-type dopant, then with a p-type dopant) to form the final channel stops beneath the field oxide regions. Still another process is described in U.S. Pat. No. 4,411,058. This self-aligned process employs a metal mask along with ion implantation to form the channel stops.

One problem associated with some prior art processing for forming the field oxides regions and channel stops is described in conjunction with FIG. 1.

As will be seen, the present invention provides a process for forming the field oxide regions and channel stops using relatively low energy ion implantation and where the implantations used to form the channel stops also form complementary wells for CMOS transistors. Transistors are formed in these wells without threshold adjusting ion implantation steps.

SUMMARY OF THE INVENTION

A process for forming channel stops on a silicon substrate along with field oxide isolation regions is described. First, spaced-apart silicon nitride members are formed on the substrate; the space between these members subsequently becoming isolation regions. A first photoresist layer is formed over at least a first one of the first silicon nitride members and extends into the isolation region. An n-type dopant, such as phosphorus is then implanted into the substrate. The photoresist layer is thick enough to prevent implantation of the ions beneath the layer, however, ions are implanted beneath the exposed silicon nitride members. Following this, a high temperature step is used to grow a field oxide region while simultaneously forming an n-type well in the substrate. Now, after removal of the photoresist layer, a second photoresist layer is formed over the previously exposed silicon nitride members which extends into the isolation region. The substrate is next subjected to another implantation step, this time with a p-type dopant. Once again, the photoresist layer is thick enough to prevent the penetration of ions into the substrate through the photoresist layer, yet the ions are implanted into the substrate beneath the exposed silicon nitride members and beneath the field oxide layer. Another high temperature step is used, this time in a nitrogen atmosphere, thereby forming a p-type well without forming addition field oxide.

BRIEF DESCRIPTION OF THE DRAWINGS

FIG. 1 is a cross sectional elevation view of a substrate showing field oxide regions as formed with a prior art process.

FIGS. 2 through 6 illustrate the currently preferred embodiment of the invention.

FIG. 2 is a cross sectional elevation view of a portion of a substrate having two spaced-apart silicon nitride members formed on a relatively thin silicon oxide layer.

FIG. 3 illustrates the substrate of FIG. 2 after the formation of a first photoresist layer and during an ion implantation step.

FIG. 4 illustrates the substrate of FIG. 3 after an oxidation step.

FIG. 5 illustrates the substrate of FIG. 4 after the formation of a second photoresist layer and during a second ion implantation step.

FIG. 6 illustrates the substrate of FIG. 5 after a second high temperature step.

DETAILED DESCRIPTION OF THE INVENTION

A semiconductor "front end" process is described for forming field oxide regions and channel stops on a silicon substrate. In the following description, numerous specific details are set forth such as specific doping levels, times, temperatures, etc. in order to provide a thorough understanding of the present invention. It will be appreciated however, by one skilled in the art, that the present invention may be practiced without these specific details. In other instances, well known steps, such as cleaning steps, are not described in order not to unnecessarily obscure the present invention in detail.

Referring first to FIG. 1, the cross sectional elevation view of the substrate 10 illustrates one problem associated with some prior art processes for forming channel stops and field oxide regions. The substrate 10 is shown with field oxide regions 11 separating the regions 12 and 13. Regions 12 and 13 are typically used for the formation of active devices. In the underlying substrate region 16, a well is often formed, for example, an n-type well may be formed to host a p-channel devices. Similarly, a p-type well may be formed at region 15 to host an n-channel device formed at region 12. Channel stops are also formed underlying the oxide region 11, such as at region 14. These channel stops may be the interface or junction between the n-well and p-well, or may be separately doped regions. In some cases, the substrate of FIG. 1 may include only a single well, for example, where the substrate 10 is of a p-type material, n-wells may be formed for the p-channel devices with the n-channel devices being formed directly in the native substrate.

One problem associated with some prior art processing is that the region 12 and the region 13 (and like regions) are on different elevations, separated by the distance 17. When additional overlying layers are formed over the substrate, planarizing these upper layers become more difficult. In fact, steps in the upper layers often results between the regions 12 and 13 and the like regions. These steps can result in problems such as non-uniform photoresist thickness and resulting dimensional variations. As will be seen with the present invention, the regions which receive the active devices are on the same elevation.

Referring now to FIG. 2, a substrate 20 is illustrated which, for the MOS processing described, is a monocrystalline silicon substrate typically lightly doped. As will be appreciated, only a portion of the substrate is illustrated in FIG. 2 and the formation of two wells separated by a single field oxide region is described in FIGS. 2 through 6. In the formation of an integrated circuit on the substrate thousands and often over a million of such regions are simultaneously formed.

In the currently preferred process, a thermally grown silicon dioxide layer 22 is first formed on the substrate 20. This layer in the currently preferred embodiment, is approximately 50 Å thick.

A silicon nitride layer is formed on the substrate over the layer 22 and, through the use of ordinary photolithographic masking techniques, the layer is masked and then etched to form silicon nitride members such as members 24 and 26. These members are spaced-apart defining a region 28. In the currently preferred embodiment, the silicon nitride members 24 and 26 are approximately 500 Å thick.

Next, a photoresist layer is formed on the substrate and, again through ordinary photolithographic techniques, the masking member 32 is formed as shown in FIG. 3. In the currently preferred embodiment layer 32 is 12,000 Å thick. The member 32 covers the silicon nitride member 24 and extends approximately midway into the region 28 covering region 28a. The photoresist layer 32 leaves exposed the region 28b and the silicon nitride masking member 36.

Now the substrate is subjected to an ion implantation step. In the currently preferred embodiment, phosphorus is implanted at an energy level of approximately 170 kev to a doping level of approximately $1 \times 10^{13}$ cm$^{-2}$. This implantation is shown in FIG. 3 as lines 30. The photoresist layer 32 is thick enough to prevent the implantation through the layer into the substrate. Thus, no ions are implanted in the substrate beneath layer 32. On the other hand, the energy level of the ions is sufficient to implant the exposed area of the substrate even under the silicon nitride member 36. The resulting implanted ions 30a are shown with the "−" symbol in FIG. 3.

Following implantation and removal of the photoresist the substrate is subjected to a high temperature step. In the currently preferred embodiment, first the substrate is heated in a steam atmosphere to 920° C. in order to grow approximately 4600 Å of silicon dioxide as shown in FIG. 4. The field oxide regions 32a, 32b and 32c are grown during this oxidation step. Note that the silicon dioxide does not grow beneath the silicon nitride members as is well known in the art. After the wet, high temperature step, the substrate is subjected to a dry high temperature step. More specifically, the substrate is subjected to a temperature of 1100° C. in a dry nitrogen atmosphere for 4 to 6 hours.

The results of this processing is shown in FIG. 4 with a formation of an n-type well 36 formed beneath the member 26 which extends approximately midway beneath the field oxide region 32b. Initially, the wet high temperature step causes some of the phosphorus dopant to segregate as the field oxide regions form. Thus, there is a somewhat higher concentration of the n-type dopant in the proximity of the field oxide regions. However, during the subsequent dry high temperature step, the dopant in the well 36 more uniformly diffuses leaving the well generally uniformly doped.

An additional photoresist layer 34 is formed over the substrate, masked and etched to define the masking member 35 shown in FIG. 5. This masking member extends approximately midway over the field oxide region 32b leaving exposed the region 28a. The substrate is then subjected to a second ion implantation step this time with boron ($B_{11}$) at an energy level of approximately 170 kev to a doping level of approximately $1 \times 10^{13}$ cm$^{-2}$. The ion implantation step is shown by lines 34 in FIG. 5 and the resultant dopant 34a by the "+" symbol. Once again, the photoresist layer is thick enough to prevent the boron atoms from being implanted beneath the photoresist layer. On the other hand, the energy level is sufficiently high to allow the ions to be implanted through the exposed field oxide regions such as region 28a and through the exposed silicon nitride member 24. (The implantation peak is below the field oxide/substrate interface). The photoresist layer 35 is approximately 25,000 Å thick in the currently preferred embodiment. After the photoresist has been stripped from the substrate, the substrate is exposed to a high temperature step. In the currently preferred embodiment, the substrate is placed in a dry nitrogen atmosphere of 1000° C. for approximately five hours. This drives the p-type dopant into the substrate forming the p-well 38 shown in FIG. 6.

The resultant substrate shown in FIG. 6 includes the p-type well 38 and the n-type well 36. Regions 40 and 42 are separated by the field oxide region 32b. A junction 44 is formed between the wells providing channel stops.

Ordinary processing may be used to form an n-channel device at the region 40 and a p-channel device at the region 42.

Importantly, it should be noted that the surface at regions 40 and 42 are on the same elevation, accordingly it is easier to planarize the substrate during subsequent processing.

It should also be noted that both wells were formed with relatively low ion implantation levels. Moreover, the doping levels in the wells for the described embodiment is adequate to permit the formation of field effect transistors in the wells without additional threshold adjusting implantation for either the p-channel or n-channel devices.

Another advantage is that no additional field implant is needed because p-well implant is done after field oxide formation, thereby avoiding boron "suck-out" at the field oxide p-well interface. Also, slight retrograde p-well profile in the active region provides surface concentration low enough for good transistor $V_T$-electron mobility ($<10^{17}$ cm$^{-3}$), yet a concentration of 4,000 Å beneath the surface has higher concentration for improved transistor punch-through characteristics ($\sim 1.5 \times 10^{17}$ cm$^{-3}$).

Thus, a process has been described for forming field oxide regions and channel stops, particularly suited for CMOS processing. Relatively low energy ion implantation steps are used in the processing.

We claim:

1. A process for forming field oxide regions and channel stops on a silicon substrate, comprising the steps of:
   forming a first and a second spaced-apart silicon nitride members on said substrate thereby defining an isolation region between said spaced-apart silicon nitride members;
   forming a first photoresist layer over said first member, said first photoresist layer extending on to and covering a first portion of said isolation region adjacent to said first silicon nitride member, a second portion of said isolation region adjacent to said second silicon nitride member being free of said first photoresist layer;
   subjecting said substrate to a first ion implantation step with a first conductivity dopant so as to implant ions of said first conductivity type into said substrate in said second portion of said isolation region and into said substrate beneath said second silicon nitride member;
   heating said substrate in a first heating step so as to form a field oxide region at said isolation region;
   forming a second photoresist layer generally over said second silicon nitride member and said second portion of said isolation region, said first silicon nitride member and said first portion of said isolation region being substantially free of said first and second layer of photoresist;
   subjecting said substrate to a second ion implantation step with a second conductivity type dopant to implant ions of said second conductivity type into said substrate beneath said first silicon nitride member and said first portion of said isolation region, said second ion implantation step being carried out after said first heating step.

2. The process defined by claim 1 wherein said first heating step forms a well of a first conductivity type generally below said second silicon nitride member, said well extending beneath said field oxide region.

3. The process defined by claim 2 including a second heating step after said second ion implantation step thereby forming a second well of a second conductivity type dopant generally beneath said first silicon nitride member.

4. The process defined by claim 3 including the step of forming a silicon dioxide layer on said substrate prior to the formation of said silicon nitride members.

5. The process defined by claim 4 wherein said first ion implantation step comprises the implantation of phosphorus.

6. The process defined by claim 5 wherein said second ion implantation step comprises the implantation of boron.

7. The process for forming field oxide isolation regions with underlying channel stops on a silicon substrate, comprising the steps of:
   forming a first insulative layer on said substrate;
   forming a silicon nitride layer on said substrate;
   forming first and second spaced-apart silicon nitride members on said first insulative layer defining an isolation region between said spaced-apart silicon nitride members;
   forming a first photoresist layer over said first silicon nitride member, said first photoresist layer extended on to and covering a first portion of said isolation region adjacent to said first silicon nitride member, a second portion of said isolation region adjacent to said second silicon nitride member being free of said first photoresist layer;
   subjecting said substrate to a first ion implantation step with a first conductivity type dopant at a first energy level, said first energy level being not sufficient to cause ions to penetrate said first photoresist layer however, said first energy level being sufficient to cause ions to penetrate said second silicon nitride member and underlying first insulation layer;
   heating said substrate in a first heating step so as to form a field oxide region at said isolation region;
   forming a second photoresist layer over said second silicon nitride member and said second portion of said isolation region, said first silicon nitride member and the portion of the field oxide overlying said first portion of said isolation region being substantially free of said first and second layer of photoresist;
   subjecting said substrate to a second ion implantation step with a second conductivity type dopant at a second energy level, said second energy level being not sufficient to cause ions to penetrate said second photoresist layer, however said second energy level being sufficient to cause ions to penetrate said first silicon nitride member and underlying first insulation layer; and the exposed field oxide region.

8. The process defined by claim 7 wherein said first heating step forms a well of a first conductivity type generally below said second silicon nitride member, said well extending beneath said field oxide region.

9. The process defined by claim 8 including a second heating step after said second ion implantation step thereby forming a second well of a second conductivity type dopant generally beneath said first silicon nitride member.

10. The process defined by claim 9 wherein said first insulation layer comprises silicon dioxide.

11. The process defined by claim 10 wherein said first ion implantation step comprises the implantation of phosphorus.

12. The process defined by claim 11 wherein said second ion implantation step comprises the implantation of boron.

* * * * *